United States Patent
Pintani et al.

(10) Patent No.: US 10,205,114 B2
(45) Date of Patent: Feb. 12, 2019

(54) ORGANIC LIGHT-EMITTING COMPOSITIONS HAVING MULTIPLE TRIPLET-ACCEPTING MATERIALS, AND DEVICES AND METHODS THEREOF

(71) Applicants: Cambridge Display Technology Limited, Godmanchester (GB); Sumitomo Chemical Company Limited, Tokyo (JP)

(72) Inventors: Martina Pintani, Godmanchester (GB); Ian Johnson, Godmanchester (GB); Francesco Di Stasio, Genoa (IT); Martin Humphries, Godmanchester (GB); Jonathan Pillow, Godmanchester (GB); Ruth Pegington, Godmanchester (GB); James Morey, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 15/507,470

(22) PCT Filed: Aug. 28, 2015

(86) PCT No.: PCT/GB2015/052512
§ 371 (c)(1),
(2) Date: Feb. 28, 2017

(87) PCT Pub. No.: WO2016/030700
PCT Pub. Date: Mar. 3, 2016

(65) Prior Publication Data
US 2017/0288163 A1    Oct. 5, 2017

(30) Foreign Application Priority Data
Aug. 28, 2014 (GB) .................... 1415245.8

(51) Int. Cl.
*H01L 29/08* (2006.01)
*H01L 51/52* (2006.01)
(Continued)

(52) U.S. Cl.
CPC .......... *H01L 51/5203* (2013.01); *C08G 61/02* (2013.01); *C08G 61/12* (2013.01);
(Continued)

(58) Field of Classification Search
CPC ........................ H01L 51/5203; C08G 61/02
(Continued)

(56) References Cited

U.S. PATENT DOCUMENTS

2006/0073357 A1* 4/2006 Brunner ............... C08G 61/123
                                                      428/690
2012/0007024 A1* 1/2012 Schols ................ H01L 51/5012
                                                      252/301.16
(Continued)

FOREIGN PATENT DOCUMENTS

GB      2 483 629 A   3/2012
GB      2 499 969 A   9/2013
WO   WO 2010/078973 A1   7/2010

OTHER PUBLICATIONS

Combined Search and Examination Report dated Jun. 25, 2015 for Application No. GB1415245.8.
(Continued)

*Primary Examiner* — Caleb Henry
(74) *Attorney, Agent, or Firm* — Wolf, Greenfield & Sacks, P.C.

(57) ABSTRACT

A composition suitable for use in an organic light-emitting layer (103) of an organic light-emitting device having an anode (101) and a cathode (105), the composition comprising a fluorescent light-emitting material, a first triplet-accepting material and a second triplet-accepting material
(Continued)

that is different from the first triplet-accepting material. The fluorescent light-emitting material may be a repeat unit of a light-emitting polymer, and the first and second triplet-accepting materials may independently be repeat units of the light-emitting polymer or may be mixed with the fluorescent light-emitting material.

14 Claims, 4 Drawing Sheets

(51) Int. Cl.
    *H01L 51/00*     (2006.01)
    *H01L 51/50*     (2006.01)
    *C08G 61/12*     (2006.01)
    *C08G 61/02*     (2006.01)
    *H01L 51/56*     (2006.01)

(52) U.S. Cl.
    CPC ...... *H01L 51/0035* (2013.01); *H01L 51/0039* (2013.01); *H01L 51/0043* (2013.01); *H01L 51/5012* (2013.01); *H01L 51/5088* (2013.01); *C08G 2261/122* (2013.01); *C08G 2261/314* (2013.01); *C08G 2261/3142* (2013.01); *C08G 2261/3162* (2013.01); *C08G 2261/342* (2013.01); *C08G 2261/411* (2013.01); *C08G 2261/5222* (2013.01); *C08G 2261/5242* (2013.01); *C08G 2261/95* (2013.01); *C08L 2205/02* (2013.01); *H01L 51/56* (2013.01)

(58) Field of Classification Search
    USPC ........................................................ 257/40
    See application file for complete search history.

(56) References Cited

U.S. PATENT DOCUMENTS

| | | | |
|---|---|---|---|
| 2012/0217869 A1* | 8/2012 | Adachi | C09K 11/06 313/504 |
| 2013/0187145 A1* | 7/2013 | Pegington | C07C 13/567 257/40 |
| 2013/0270535 A1* | 10/2013 | Pillow | H01L 51/5203 257/40 |
| 2013/0292657 A1* | 11/2013 | Conway | C09K 11/06 257/40 |
| 2014/0151646 A1* | 6/2014 | Xia | H01L 51/52 257/40 |
| 2014/0183469 A1* | 7/2014 | Jakobsson | H01L 51/56 257/40 |
| 2014/0224329 A1* | 8/2014 | Congreve | H01L 51/0055 136/263 |
| 2016/0104847 A1* | 4/2016 | Xia | H01L 51/0052 257/40 |

OTHER PUBLICATIONS

International Search Report and Written Opinion dated Nov. 20, 2015 for Application No. PCT/GB2015/052512.

* cited by examiner

ORGANIC LIGHT-EMITTING COMPOSITIONS HAVING MULTIPLE TRIPLET-ACCEPTING MATERIALS, AND DEVICES AND METHODS THEREOF

RELATED APPLICATIONS

This application is a national stage filing under 35 U.S.C. § 371 of international PCT application, PCT/GB2015/052512, filed Aug. 28, 2015, which claims priority to United Kingdom patent application, GB 1415245.8, filed Aug. 28, 2014, each of which is incorporated herein by reference in its entirety.

BACKGROUND OF THE INVENTION

Electronic devices comprising active organic materials are attracting increasing attention for use in devices such as organic light emitting diodes, organic photovoltaic devices, organic photosensors, organic transistors and memory array devices. Devices comprising organic materials offer benefits such as low weight, low power consumption and flexibility. Moreover, use of soluble organic materials allows use of solution processing in device manufacture, for example inkjet printing or spin-coating.

A typical organic light-emissive device ("OLED") is fabricated on a glass or plastic substrate coated with a transparent anode such as indium-tin-oxide ("ITO"). A thin layer of a film of at least one electroluminescent organic material is provided over the first electrode. Finally, a cathode is provided over the layer of electroluminescent organic material. Charge transporting, charge injecting or charge blocking layers may be provided between the anode and the electroluminescent layer and/or between the cathode and the electroluminescent layer.

In operation, holes are injected into the device through the anode and electrons are injected into the device through the cathode. The holes and electrons combine in the organic electroluminescent layer to form excitons which then undergo radiative decay to give light.

In WO90/13148 the organic light-emissive material is a conjugated polymer such as poly(phenylenevinylene). In U.S. Pat. No. 4,539,507 the organic light-emissive material is of the class known as small molecule materials, such as tris-(8-hydroxyquinoline) aluminium ("Alq$_3$"). These materials electroluminesce by radiative decay of singlet excitons (fluorescence) however spin statistics dictate that up to 75% of excitons are triplet excitons which undergo non-radiative decay, i.e. quantum efficiency may be as low as 25% for fluorescent OLEDs-see, for example, Chem. Phys. Lett., 1993, 210, 61, Nature (London), 2001, 409, 494, Synth. Met., 2002, 125, 55 and references therein.

It has been postulated that the presence of triplet excitons, which may have relatively long-lived triplet excited states, can be detrimental to OLED performance as a result of triplet-triplet or triplet-singlet interactions.

WO 2005/043640 discloses that blending a perylene derivative with an organic light-emissive material in an organic light-emissive device can give a small increase in the lifetime of the device. However, while higher concentrations of perylene derivative give greater improvements in lifetime this results in a significant red-shift in the emission spectrum.

US 2007/145886 discloses an OLED comprising a triplet-quenching material to prevent or reduce triplet-triplet or triplet-singlet interactions.

WO 2012/086670 and WO 2012/086671 disclose a composition of a light-emitting material and certain polymers.

US 2005/095456 discloses an OLED having a light-emitting layer comprising a host material, a dye or pigment and an additive exhibiting an absorption edge of which energy level is higher than that of an absorption edge of the dye or the pigment.

SUMMARY OF THE INVENTION

In a first aspect the invention provides a composition comprising a light-emitting material, a first triplet-accepting material and a second triplet-accepting material that is different from the first triplet-accepting material.

In a second aspect the invention provides a formulation comprising a composition according to the first aspect and at least one solvent.

In a third aspect the invention provides an organic light-emitting device comprising an anode, a cathode and a light-emitting layer between the anode and the cathode wherein the light-emitting layer comprises a composition according to the first aspect.

In a fourth aspect the invention provides a method of forming an organic light-emitting device according to the second aspect, the method comprising the steps of forming the light-emitting layer over one of the anode and cathode, and forming the other of the anode and cathode over the light-emitting layer.

"Triplet-accepting material" as used herein means a material that reduces the triplet exciton population of a light-emitting material. The effect of a material on the triplet exciton population of a light-emitting material may be measured by quasi-continuous wave excited state absorption.

DETAILED DESCRIPTION OF THE INVENTION

Figure 1:
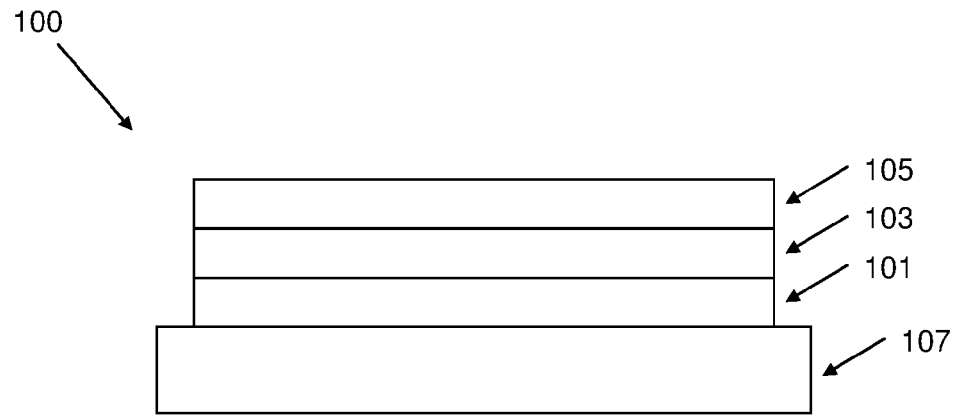
FIG. 1 illustrates an organic light-emitting device according to an embodiment of the invention.

FIG. 1 illustrates an OLED according to an embodiment of the invention.

The OLED 100 comprises an anode 101, a cathode 105 and a fluorescent light-emitting layer 103 between the anode and the cathode. The device is supported on a substrate 107, for example glass or plastic.

One or more further layers may be provided between the anode 101 and cathode 105, for example hole-transporting layers, electron transporting layers, hole blocking layers and electron blocking layers. The device may contain more than one light-emitting layer. A further light-emitting layer, if present, may be a fluorescent or phosphorescent light-emitting material.

Exemplary device structures include:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, at least one of a hole-transporting layer and hole injection layer is present.

Preferably, both a hole injection layer and hole-transporting layer are present.

Suitable fluorescent light-emitting materials of fluorescent light-emitting layer 103 include red, green and blue light-emitting materials.

A blue emitting material may have a photoluminescent spectrum with a peak in the range of 400-490 nm, optionally 420-490 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

The fluorescent light-emitting layer 103 contains a fluorescent light-emitting material and at least two different triplet-accepting materials.

The fluorescent light-emitting material and the two different triplet-accepting materials may be blended.

The fluorescent light-emitting material may be a repeat unit of a light-emitting polymer. In this case, one or both of the triplet-accepting materials may be covalently bound to the light-emitting polymer as a side-chain group of a repeat unit of the polymer; as a repeat unit in the backbone of the polymer; or as an end-group of the polymer.

Accordingly, it will be understood that a "composition" as described herein may be a single polymer containing the fluorescent light-emitting material and the first and second triplet-accepting material, or it may be a mixture of two or more materials.

In a preferred embodiment the fluorescent light-emitting material is a polymer; a first one of the triplet-accepting materials is provided as a repeat unit of the polymer; and a second one triplet-accepting materials is mixed with the fluorescent light-emitting polymer.

If a triplet-accepting material is provided as a repeat unit of a light-emitting polymer then it is preferably provided in an amount in the range of at least about 0.005 mol % or at least 0.01 mol %, up to about 5 mol %, optionally up to about 1 mol %, optionally up to about 0.5 mol %.

If a triplet-accepting material is mixed with the light-emitting material then the triplet-accepting material is preferably provided in an amount in the range of 0.1-10 weight %, optionally 1-5 weight %, of the light-emitting composition.

The fluorescent light-emitting layer 103 may consist essentially of the fluorescent light-emitting material and triplet-accepting materials or may contain further materials. In the case where the fluorescent light-emitting material is a polymer, the first and second triplet accepting materials may each independently be repeat units of the fluorescent light-emitting polymer or may be mixed with the fluorescent light-emitting polymer.

In operation, holes and electrons are injected into the device to form singlet and triplet excitons. Singlet excitons on the fluorescent light-emitting material may undergo radiative decay to produce fluorescence. Triplet excitons may be formed on the first or second triplet accepting material, or triplet excitons formed on the fluorescent light-emitting material may be transferred to the triplet-accepting materials and removed from the light-emitting layer by either non-radiative triplet exciton quenching or by delayed fluorescence arising from triplet-triplet annihilation. Accordingly, substantially all light emitted from the light-emitting layer containing triplet-accepting materials is fluorescent light.

Triplet quenching and triplet-triplet annihilation mechanisms are described below in turn. For simplicity, each mechanism is described as illustrated using a single triplet-accepting material however it will be appreciated that devices as described herein contain two or more triplet-accepting materials.

Triplet Quenching

Figure 2:
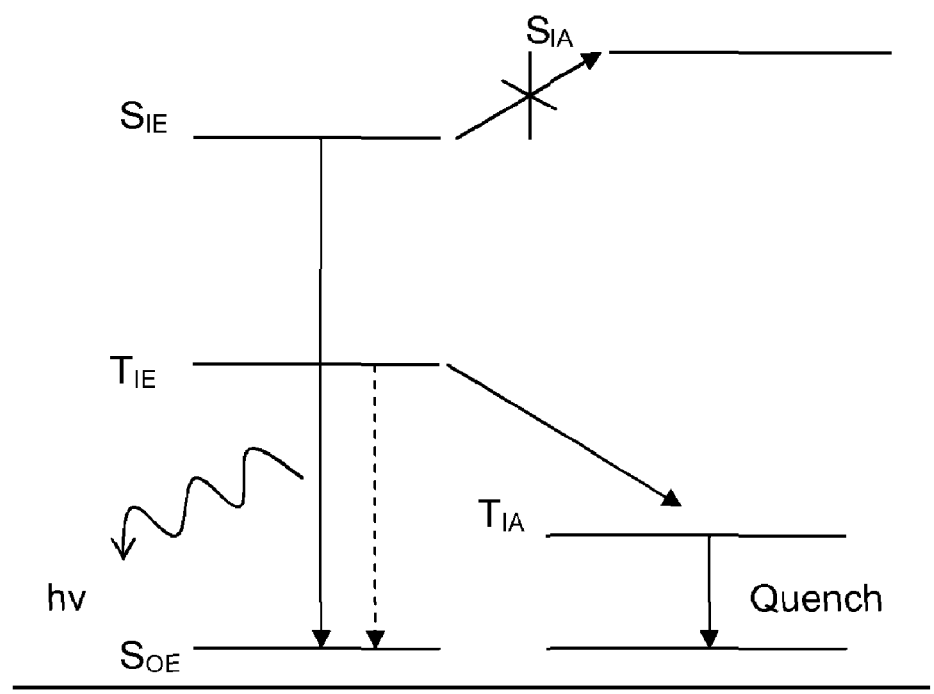
FIG. 2 is a schematic illustration of triplet quenching.

FIG. 2 illustrates a first energy transfer mechanism for an exemplary OLED. For the avoidance of any doubt energy level diagrams herein, including FIG. 2, are not drawn to any scale.

FIG. 2 illustrates energy transfer for an OLED provided with a fluorescent light emitting material having a singlet excited state energy level $S_{1E}$ and a singlet ground state energy level $S_{0E}$. Singlet excitons having energy $S_{1E}$ decay by emission of fluorescent light hv, illustrated by the solid arrow between $S_{1E}$ and $S_{0E}$ in FIG. 2. Triplet-triplet exciton interactions or triplet-singlet exciton interactions may create "super-excited" states on the light-emitting material. Without wishing to be bound by any theory, it is believed that formation of these highly energetic "super-excited" states on the light emitting material may be detrimental to operational lifetime of the device. However, by providing a compound having an excited triplet state energy level $T_{1A}$ that is lower than $T_{1E}$, it is possible for triplet excitons to be transferred for quenching to the triplet accepting polymer, the alternative of radiative decay from $T_{1E}$ to $S_{0E}$, illustrated by a dotted line in FIG. 1, being a spin-forbidden process.

$S_1$ and $T_1$ levels of a light-emitting material can be measured from its fluorescence and gated low-temperature phosphorescence spectra respectively.

The $S_1$ and $T_1$ levels of a triplet accepting material may be measured from its fluorescence and gated low-temperature phosphorescence spectra respectively.

The photoluminescent fluorescence spectrum of a material may be measured by casting a film of the material onto a quartz substrate to achieve transmittance values of 0.3-0.4 and measuring in a nitrogen environment using apparatus C9920-02 supplied by Hamamatsu.

$T_1$ values as described herein may be measured from the energy onset of the phosphorescence spectrum measured by low temperature phosphorescence spectroscopy (A. van Dijken et al, Journal of the American Chemical Society, 2004, 126, p 7718).

Materials having $S_1$ and $T_1$ levels suitable for use as triplet-accepting materials with a given light-emitting material may be selected from materials described in Handbook of Photochemistry, $2^{nd}$ Edition, Steven L Murov, Ian Carmichael and Gordon L Hug and references therein, the contents of which are incorporated herein by reference.

The triplet accepting compound has a lowest singlet excited state energy level $S_{1A}$ that is higher than the lowest singlet excited state energy level $S_{1E}$. This is to substantially or completely prevent transfer of singlet excitons from $S_{1E}$ to $S_{1A}$. Preferably, $S_{1A}$ is at least kT higher in energy than $S_{1E}$ in order to prevent any substantial back-transfer of excitons and fluorescence from the triplet-accepting compound. Likewise, $T_{1E}$ is preferably at least kT higher in energy than $T_{1A}$. Although it may be preferable for energy level $S_{1A}$ to be greater than $S_{1E}$, it will be appreciated that this is not essential in order for triplet absorption to occur. Some light emission from the triplet-accepting compound may be observed. Optionally, light emitted from a composition of a fluorescent material and triplet-accepting materials has a peak wavelength that is the same as or no more than 10 nm longer than the peak wavelength of light emitted from the fluorescent material alone.

Triplet-Triplet Annihilation

Figure 3:
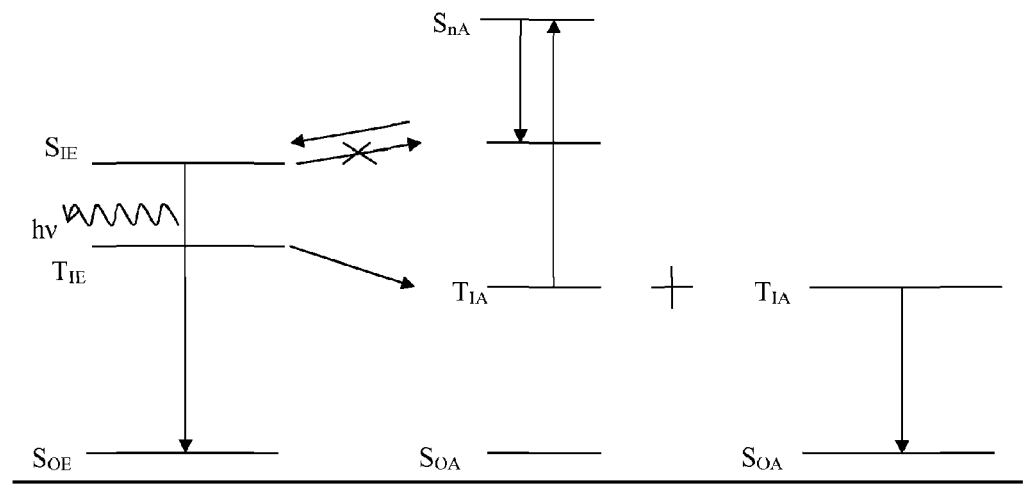
FIG. 3 is a schematic illustration of a first triplet-triplet annihilation mechanism.

FIG. 3 illustrates a second energy transfer mechanism for an exemplary OLED.

According to this embodiment, triplet-triplet annihilation (TTA), caused by an interaction between two triplet-accepting units, results in a triplet-triplet annihilated singlet exciton having energy of up to $2 \times T_{1A}$, wherein $T_{1A}$ represents the triplet excited state energy level of the triplet-accepting material. This singlet exciton, formed on a first of the two triplet-accepting units, has energy level $S_{nA}$ that is higher in energy than $S_{1A}$ and $S_{1E}$ and so it may transfer to $S_{1A}$ and then to $S_{1E}$ from which light hv may be emitted as delayed fluorescence. The triplet exciton on the second of the two triplet-accepting units may decay to the ground state $T_{0A}$.

Initially, the triplet exciton formed at $T_{1E}$ is transferred to $T_{1A}$. By providing a triplet-accepting compound having energy level $T_{1A}$ that is lower than $T_{1E}$, rapid transfer of excitons from $T_{1E}$ to $T_{1A}$ may occur. This transfer is relatively rapid compared to the rate of decay of triplet excitons from $T_{1E}$ to $S_{0E}$, illustrated by a dotted arrow in FIG. 1, which is a spin-forbidden process. The energy gap between $T_{1E}$ and $T_{1A}$ is preferably greater than kT in order to avoid back-transfer of excitons from $T_{1A}$ to $T_{1E}$. Likewise, the energy gap between $S_{1A}$ and $S_{1E}$ is preferably greater than kT in order to avoid back-transfer of excitons from $S_{1E}$ to $S_{1A}$.

It will be appreciated that, unlike phosphorescent dopants, the triplet-accepting material does not provide an energetically favourable pathway for triplets to undergo radiative decay to produce phosphorescence, and as a result substantially none of the energy of the triplet exciton absorbed by the triplet-accepting material is lost from the triplet-accepting polymer in the form of phosphorescent light emission from the triplet-accepting polymer.

Figure 4:
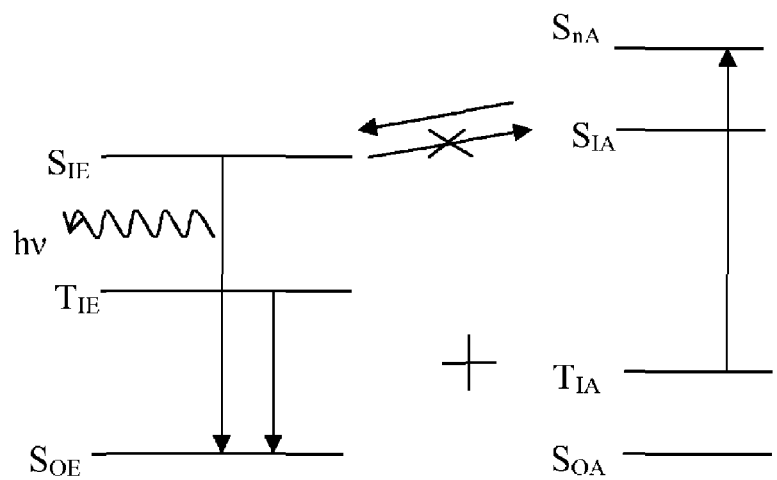
FIG. 4 is a schematic illustration of a second triplet-triplet annihilation mechanism.

FIG. 4 illustrates a third energy transfer mechanism for an exemplary OLED.

In this case, triplet-triplet annihilation occurs between the triplet exciton of energy $T_{1A}$ located on the triplet accepting unit and the triplet exciton of energy $T_{1E}$ located on the light-emitting polymer. It will be appreciated that this results in a triplet-triplet annihilated singlet exciton (TTAS) having an energy of up to $T_{1E}+T_{1A}$. This singlet exciton's energy level of $S_{nA}$ is higher in than that of $S_{1E}$ and so it may transfer its energy to $S_{1A}$ and from there to $S_{1E}$ from which light hv may be emitted as delayed fluorescence.

In a further mechanism (not illustrated), a TTAS may be formed by TTA between triplet excitons on the two different triplet accepting materials.

In FIGS. 2-4, although it may be preferable for the energy level $S_{1A}$ to be greater than $S_{1E}$, it will be appreciated that this is not essential in order for triplet absorption to occur.

Without wishing to be bound by any theory, it is believed that avoiding formation of super-excited states on the light-emitting material formed during OLED driving, either by triplet quenching or by TTA, may improve device lifetime. Moreover, by utilising a triplet accepting unit to generate TTA to produce stable delayed fluorescence it is possible to improve efficiency as compared to a device in which triplet excitons are quenched (as illustrated in FIG. 2) or as compared to a device in which there is no triplet accepting material wherein intensity of delayed fluorescence may drop sharply following initial OLED driving.

Figure 5:
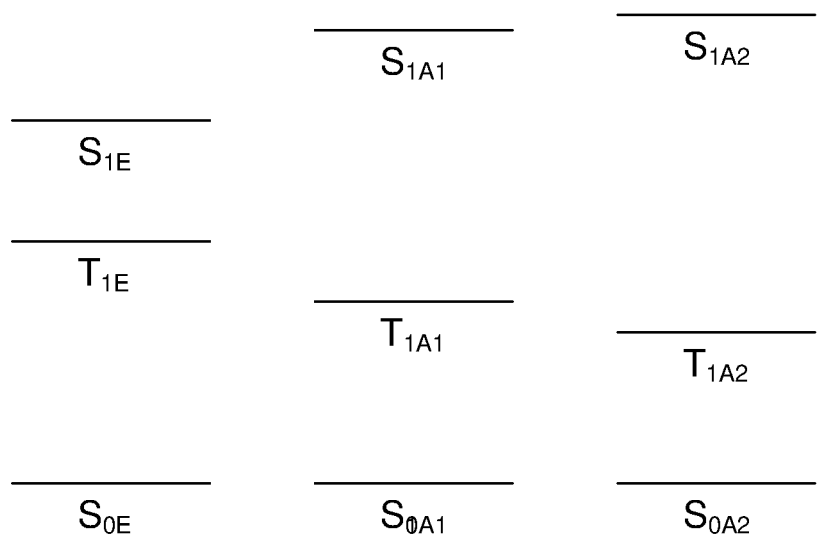
FIG. 5 is a schematic illustration of energy levels of a composition according to an embodiment of the invention.

FIG. 5 illustrates energy levels of a light-emitting composition according to an embodiment of the invention. The composition comprises a light-emitting material having a lowest singlet excited state and a lowest triplet excited state $T_{1E}$; a first triplet accepting material having a lowest singlet excited state $S_{1A1}$ and a lowest triplet excited state $T_{1E1}$; and a second triplet-accepting material having a lowest singlet excited state $S_{1E2}$ and a lowest triplet excited state $T_{1E2}$.

The following inequalities apply:

$S_{1E} \leq S1_{A1}$
$S_{1E} \leq S1_{A2}$
$T_{1E} \geq T_{1A1}$
$T_{1E} \geq T_{1A2}$ The effect of a material on triplet exciton density on a light-emitting material, either by triplet exciton quenching or TTA, may be determined by quasi-continuous wave (quasi-cw) excited state absorption. It will be appreciated that triplet-accepting materials will reduce the density of triplet excitons in a light-emitting layer, either by triplet exciton quenching or TTA, and a triplet-accepting material having a lowest triplet excited state lower than that of the emitting material is present if a reduction in triplet exciton population is observed when that material is used in combination with a light-emitting material as compared to the measured triplet exciton population on a light-emitting material alone.

Probes of triplet population may be performed as described in King, S., Rothe, C. & Monkman, A. "Triplet build in and decay of isolated polyspirobifluorene chains in dilute solution" *J. Chem. Phys.* 121, 10803-10808 (2004), and Rothe, C., King, S. M., Dias, F. & Monkman, A. P. "Triplet exciton state and related phenomena in the beta-phase of poly(9,9-dioctyl)fluorene" *Physical Review B* 70, (2004), which describe probes of polyfluorene triplet population performed at 780 nm. The skilled person will understand how to modify this probe for other light-emitting materials based on the excited state absorption features of those materials.

It will be appreciated that it is possible for both triplet quenching and TTA to occur within the same device, and that the amount of delayed fluorescence will depend on factors such as the concentration of light emitting material, the concentration of triplet accepting materials and the lifetimes of triplet excitons on the light emitting material and the triplet accepting materials.

The lifetime of a triplet exciton on a triplet quenching material is preferably no more than about 20 ns, or no more than about 10 ns. Preferably, the composition contains a triplet-accepting material that facilitates triplet quenching, and a triplet-accepting material that facilitate TTA.

The triplet-quenching material may degrade during driving of a device containing a composition containing a triplet-accepting material that that facilitates triplet quenching and a triplet-accepting material that facilitate TTA. In this case, the ratio of triplets undergoing TTA:triplets that are quenched may increase during driving of the device. As a result, efficiency lost due to triplet quenching may be recovered during driving of the device, offsetting the fall in efficiency that is commonly observed during driving of a device.

The lifetime of excited state triplets residing on a triplet-accepting material that facilitates TTA is optionally at least 1 microsecond, optionally at least 10 microseconds, optionally at least 100 microseconds. A higher triplet exciton lifetime may increase the likelihood of TTA.

The lifetime τ of a triplet exciton is its half-life, which may be measured by flash photolysis to measure monomolecular triplet lifetime as described in Handbook of Photochemistry, 2$^{nd}$ Edition, Steven L Murov, Ian Carmichael and Gordon L Hug and references therein, the contents of which are incorporated herein by reference.

Light emitted from light-emitting compositions of the invention includes delayed fluorescence as described above, as well as fluorescence arising directly from radiative decay of singlet excitons formed by recombination of holes and electrons on the light-emitting material ("prompt fluorescence").

The skilled person will be aware of methods to determine the presence of delayed fluorescence in light emitted from a light-emitting composition, as distinct from prompt fluorescence, for example by measuring light emission from a light-emitting composition following prompt fluorescence.

In the case of an OLED comprising the light-emitting composition, the delayed fluorescence can originate either from a TTA process, or from recombination of trapped charges with relatively long lifetimes. The TTA process can be distinguished from the trapped charge recombination process by applying a short spike of negative bias whilst measuring the intensity of the delayed fluorescence as described in detail by Popovic, Z. D. & Aziz, H. Delayed electroluminescence in small molecule based organic light emitting diodes: evidence for triplet-triplet annihilation and recombination centre mediated light generation mechanism. J. Appl. Phy. 98, 013510-5 (2005). If the negative bias has no lasting effect on the intensity of the delayed fluorescence, TTA is indicated (as opposed to non-prompt fluorescence arising from recombination of trapped charges where the delayed fluorescence is reduced after removal of the bias).

Triplet-Accepting Materials

The first and second triplet-accepting materials may independently be mixed with the fluorescent light-emitting material or may be covalently bound thereto.

If the fluorescent light-emitting material is a polymer then one or both of the first and second triplet-accepting materials may be provided as repeat units in the backbone of the light-emitting polymer; side groups pendant from the polymer backbone; or end-groups of the polymer.

One or both of the triplet-accepting materials may be provided as a component of a triplet-accepting polymer that is mixed with the fluorescent light-emitting material.

Fluorescent light-emitting polymers and triplet-accepting polymers as described herein may be conjugated or non-conjugated. "Conjugated polymer" as used herein means that repeat units in the backbone of the polymer are conjugated together. The conjugation length of a conjugated polymer may extend along the whole length of the polymer backbone, or conjugation along the backbone may be interrupted. "Non-conjugated polymer" as used herein means that substantially no conjugation exists between repeat units in the polymer backbone. Optionally, a non-conjugated polymer is substantially free of unsaturated groups in the polymer backbone.

Conjugated fluorescent light-emitting polymers are preferably co-polymers comprising fluorescent light-emitting repeat units and one or more further repeat units. Exemplary further repeat units may be triplet-accepting units as described above or further co-repeat units.

In a preferred embodiment, the fluorescent light-emitting material is a polymer; the first triplet-accepting material is bound to the light-emitting polymer; and the second triplet-accepting material is mixed with the light-emitting polymer. Preferably, the first triplet-accepting material is provided as an end group, as a side-chain group or as a repeat unit of the light-emitting polymer.

Exemplary first triplet accepting materials have formula (I):

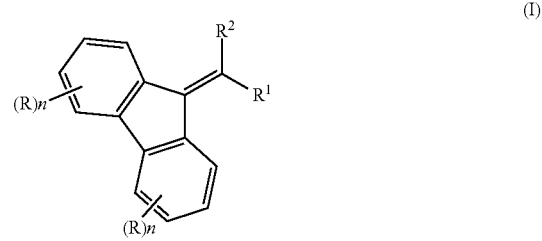

$R^1$ and $R^2$ are each independently H or a substituent; R in each occurrence is a substituent; n in each occurrence is independently 0, 1, 2, 3 or 4; and $R^1$ and $R^2$ may be linked to form a monocyclic or polycyclic ring.

In a preferred embodiment $R^2$ is an aryl or heteroaryl group Ar that may be unsubstituted or substituted with one or more substituents, and Ar and $R^1$ may be linked to form a ring.

Materials of formula (I) are preferably provided as end-groups, side-chain groups or repeat units of a light-emitting polymer that are covalently bound to the polymer through any of $R^1$ $R^2$ and the fluorene group of formula (I).

First triplet accepting repeat units of formula (I) may have formula (Ia) or (Ib)

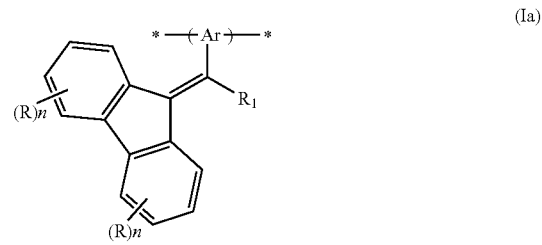

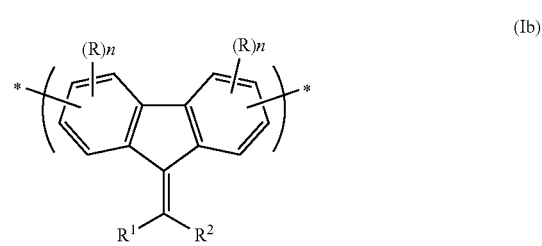

Exemplary first triplet accepting side-groups or end-groups of a polymer have formula (Ic) or (Id):

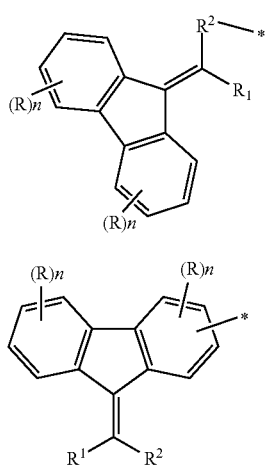

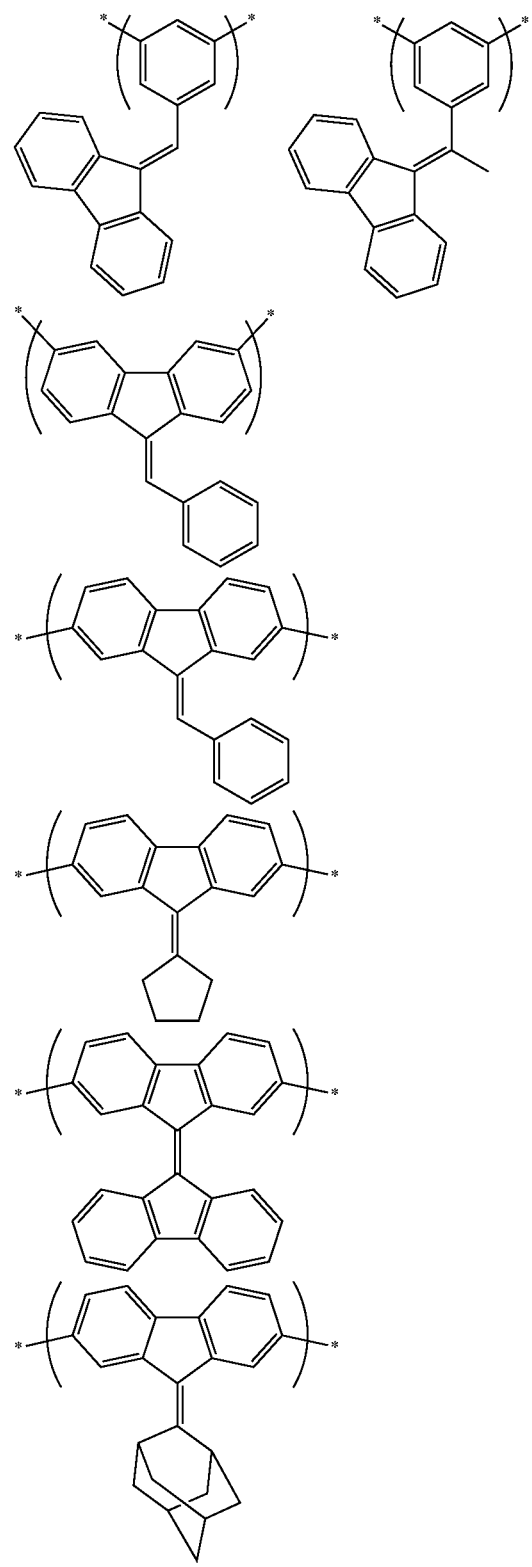

In the case where $R^2$ is Ar, Ar may be unsubstituted or substituted with one or more substituents $R^5$. Where present, substituents $R^5$ may each independently be selected from the group consisting of: alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F; aryl and heteroaryl groups that may be unsubstituted or substituted with one or more substituents, preferably phenyl substituted with one or more $C_{1-20}$ alkyl groups; F; CN and $NO_2$.

$R^1$ may be selected from the group consisting of:

H;

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F; and aryl and heteroaryl groups that may be unsubstituted or substituted with one or more substituents, preferably phenyl substituted with one or more $C_{1-20}$ alkyl groups.

Preferably, $R^1$ is H or a $C_{1-40}$ hydrocarbyl group.

If n is a positive integer then R may be selected from the group consisting of alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F; aryl and heteroaryl groups that may be unsubstituted or substituted with one or more substituents, preferably phenyl substituted with one or more $C_{1-20}$ alkyl groups; F; CN and $NO_2$.

Preferably, n in each occurrence is 0.

Preferably, repeat units of formula (I) are linked directly to aryl or heteroaryl groups of adjacent repeat units in the polymer backbone. The linking positions of Ar for linking the unit of formula (I) to adjacent repeat units in the polymer backbone may be selected to control the extent of conjugation across the repeat unit.

In a preferred embodiment, Ar is phenyl that may be unsubstituted or substituted with one or more substituents. In the case of a repeat unit of formula (Ia) the two linking groups of a phenyl group Ar may be arranged to provide ortho, meta- or para-linkage of the phenyl group to adjacent repeat units.

In another preferred embodiment, Ar is fluorene that may be unsubstituted or substituted with one or more substituents.

In the case of a repeat unit of formula (Ib) the repeat unit may be linked through any two of the 2, 3, 6 and 7 positions of the fluorene unit.

Exemplary repeat units of formula (I) may be selected from the following units:

-continued

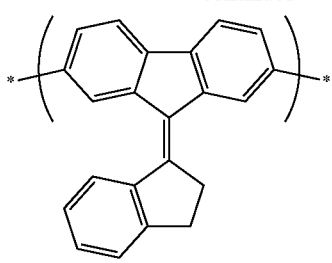

Exemplary side-groups or end-groups of formula (I) include the following units.

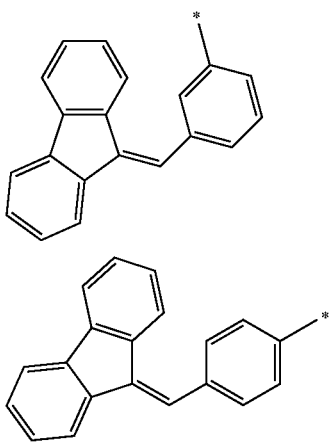

The fluorene unit of the repeat units, side-groups or end-groups of formula (I) illustrated above may be unsubstituted or substituted with one or more substituents R as described above.

In the case where $R^2$ of a repeat unit, side-group or end-group of formula (I) is Ar then Ar may be substituted, for example as illustrated below:

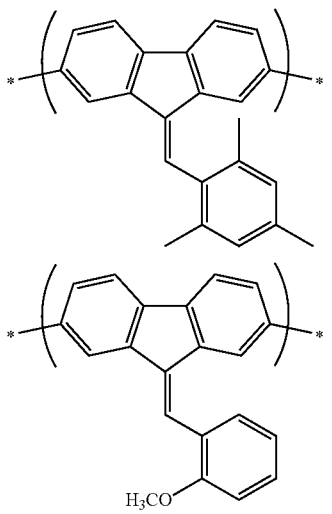

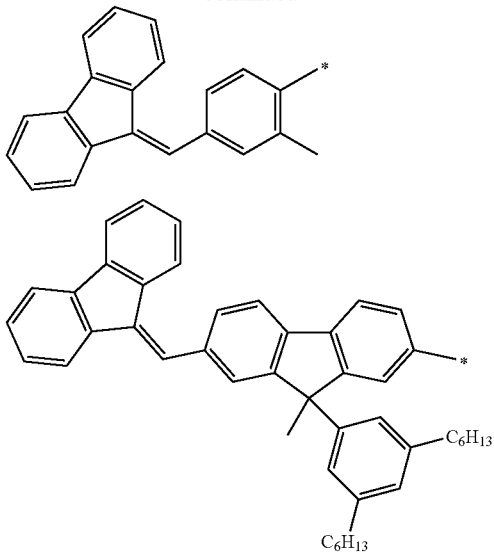

In the case where $R^1$ and $R^2$ are linked to form a monocyclic or polycyclic ring then the monocyclic or polycyclic ring may be unsubstituted or substituted with one or more substituents. Substituents, where present, may each independently be selected from substituents $R^5$ described above.

A group of formula (Ic) or (Id) present in a polymer side-chain may be directly linked to the backbone of the polymer or may be spaced apart therefrom by a spacer group Sp. Exemplary spacer groups Sp include arylene groups that may be unsubstituted or substituted with one or more substituents; $C_{1-20}$ alkyl groups wherein one or more non-adjacent C atoms of the alkyl group may be replaced by O, S, Si, C=O or COO or unsubstituted or substituted arylene or heteroarylene. An exemplary arylene group is phenylene that may be unsubstituted or substituted with one or more substituents, for example one or more $C_{1-10}$ alkyl groups.

An exemplary repeat unit having a unit of formula (I) in a side-chain thereof is as illustrated below:

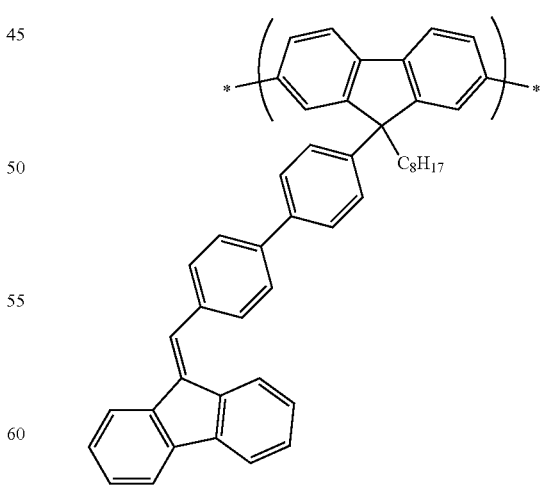

Preferably, the second triplet-accepting material is mixed with the fluorescent light-emitting material.

The second triplet-accepting material may be a polycyclic aromatic compound. "Polycyclic aromatic hydrocarbon" as used herein means a hydrocarbon structure of two or more fused rings wherein all atoms of the fused rings are sp² hybridised. Optionally, the polycyclic aromatic hydrocarbon contains no more than 4 fused benzene rings.

The polycyclic aromatic compound may be a side-group, backbone repeat unit or end-group of a polymer.

The polycyclic aromatic compound may be selected from anthracene and pyrene, each of which may be unsubstituted or substituted with one or more substituents. The polycyclic aromatic compound may be a repeat unit of formulae (II) and (III) of a polymer:

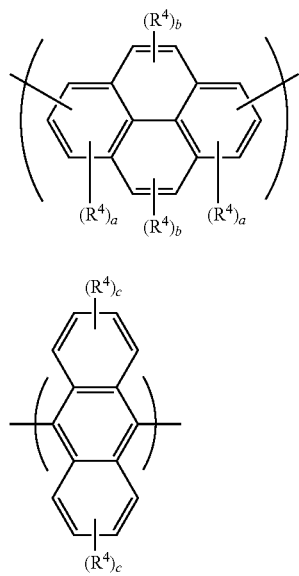

wherein $R^4$ in each occurrence is independently a substituent; each a is independently 0, 1 or 2; each b is independently 0, 1 or 2; and each c is 0, 1, 2, 3 or 4.

The repeat unit of formula (II) may have formula (IIa):

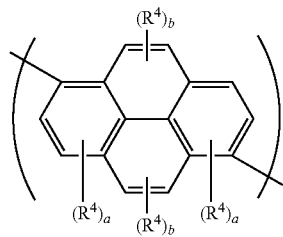

Optionally, one a and/or at least one b is at least 1, and each $R^4$ is independently selected from $C_{1-40}$ hydrocarbyl.

Optionally at least one a and/or at least one b is at least 1 and each $R^4$ is independently selected from $C_{1-20}$ alkyl wherein non-adjacent C atoms of the $C_{1-20}$ alkyl may be replaced by O, S, C=O, COO or $NR^{11}$ wherein $R^{11}$ is a substituent, for example a $C_{1-40}$ hydrocarbyl group.

Exemplary repeat units of formula (II) and (III) include the following:

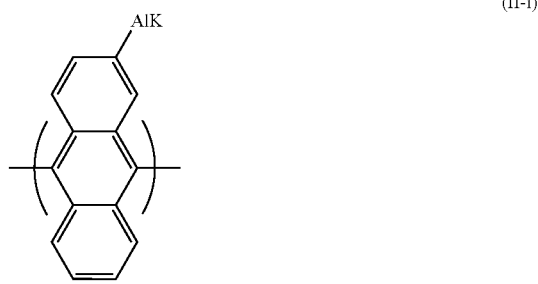

wherein Alk is selected from $C_{1-20}$ alkyl.

In the case where a first and/or second triplet-accepting material is provided as a repeat unit of a light-emitting polymer, the first and second triplet accepting repeat units may each form up to 10 mol % of the repeat units of the polymer, optionally up to 5 mol %, optionally up to 1 mol %.

If the fluorescent material is mixed with one or both of the first and second triplet accepting materials then the weight ratio of the fluorescent light-emitting material to the or each triplet-accepting material that it is mixed with may be in the range 80:20-99.5:0.5.

Conjugated triplet-accepting polymers are preferably co-polymers comprising triplet-accepting repeat units and one or more further repeat units.

Exemplary further co-repeat units of fluorescent or triplet-accepting conjugated polymers include phenylene, fluorene and dihydrophenanthrene repeat units, each of which may be unsubstituted or substituted with one or more substituents. The further co-repeat units may form 0.5-90 mol % of the repeat units of the polymer, optionally 5-50 mol % or 5-40 mol %.

Optionally, triplet-accepting polymers contain triplet accepting repeat units separated from one another by a further unit. Optionally, triplet-accepting polymers contain an alternating AB repeat unit structure wherein A is a triplet-accepting repeat unit and B is a co-repeat unit. Polymers of this type may be prepared by Suzuki polymerisation.

One preferred class of co-repeat units have formula (VI):

wherein q in each occurrence is independently 0, 1, 2, 3 or 4, optionally 1 or 2; n is 1, 2 or 3; and $R^3$ independently in each occurrence is a substituent.

Where present, each $R^3$ may independently be selected from the group consisting of:
alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula —$(Ar^3)_r$— wherein each $Ar^3$ is independently an aryl or heteroaryl group and r is at least 2, preferably a branched or linear chain of phenyl groups each of which may be unsubstituted or substituted with one or more $C_{1-20}$ alkyl groups;

a group of formula -(Sp)m-TAU wherein Sp is a spacer group as described above, m is 0 or 1, and TAU is a triplet-accepting unit, optionally a triplet-accepting unit of formula (I); and a crosslinkable-group, for example a group comprising a double bond such and a vinyl or acrylate group, or a benzocyclobutane group.

In the case where $R^3$ comprises an aryl or heteroaryl group, or a linear or branched chain of aryl or heteroaryl groups, the or each aryl or heteroaryl group may be substituted with one or more substituents $R^7$ selected from the group consisting of:

alkyl, for example $C_{1-20}$ alkyl, wherein one or more non-adjacent C atoms may be replaced with O, S, substituted N, C=O and —COO— and one or more H atoms of the alkyl group may be replaced with F;

$NR^9_2$, $OR^9$, $SR^9$, $SiR^9_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^9$— wherein $R^9$ is as described above.

Preferably, each $R^3$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

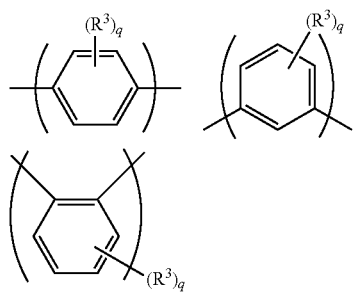

A particularly preferred repeat unit of formula (VI) has formula (VIa):

Substituents $R^3$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

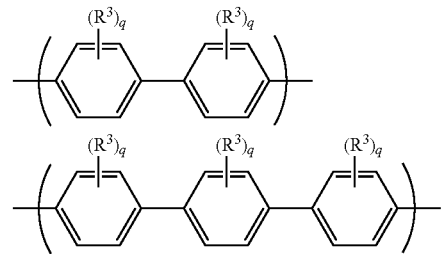

A preferred repeat unit has formula (VIb):

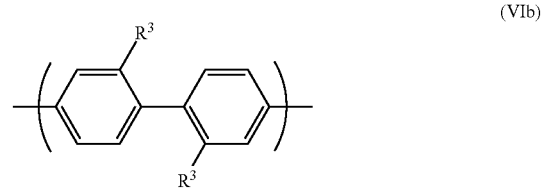

The two $R^3$ groups of formula (VIb) may cause steric hindrance between the phenyl rings they are bound to, resulting in twisting of the two phenyl rings relative to one another.

A further class of co-repeat units is optionally substituted fluorene repeat units, such as repeat units of formula (VII):

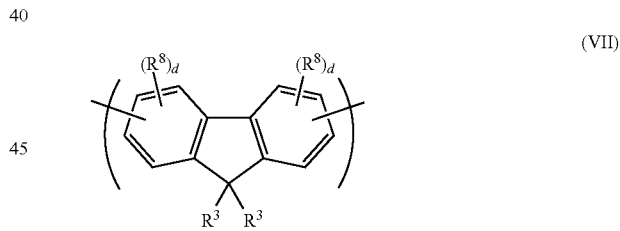

wherein $R^3$ in each occurrence is the same or different and is a substituent as described with reference to formula (VI), and wherein the two groups $R^3$ may be linked to form an unsubstituted or substituted ring; $R^8$ is a substituent; and d is 0, 1, 2 or 3.

In a preferred embodiment, at least one group R3 has formula -(Sp)m-TAU.

The aromatic carbon atoms of the fluorene repeat unit may be unsubstituted, or may be substituted with one or more substituents $R^8$. Exemplary substituents $R^8$ are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —NR$^5$— wherein R$^5$ is C$_{1-20}$ alkyl; unsubstituted phenyl; or phenyl substituted with one or more C$_{1-20}$ alkyl groups.

The extent of conjugation of repeat units of formula (VII) to aryl or heteroaryl groups of adjacent repeat units may be controlled by (a) linking the repeat unit through the 3- and/or 6-positions to limit the extent of conjugation across the repeat unit, and/or (b) substituting the repeat unit with one or more substituents R$^8$ in or more positions adjacent to the linking positions in order to create a twist with the adjacent repeat unit or units, for example a 2,7-linked fluorene carrying a C$_{1-20}$ alkyl substituent in one or both of the 3- and 6-positions.

The repeat unit of formula (VII) may be an optionally substituted 2,7-linked repeat unit of formula (VIIa):

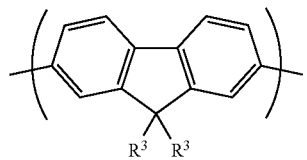

(VIIa)

Optionally, the repeat unit of formula (VIIa) is not substituted in a position adjacent to the 2- or 7-position. Linkage through the 2- and 7-positions and absence of substituents adjacent to these linking positions provides a repeat unit that is capable of providing a relatively high degree of conjugation across the repeat unit.

The repeat unit of formula (VII) may be an optionally substituted 3,6-linked repeat unit of formula (VIIb)

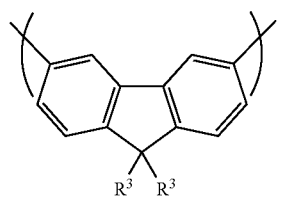

(VIIb)

The extent of conjugation across a repeat unit of formula (VIIb) may be relatively low as compared to a repeat unit of formula (VIIa).

Another exemplary co-repeat unit has formula (VIII):

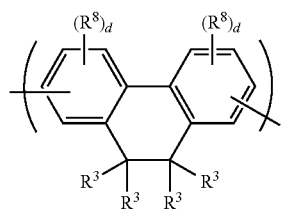

(VIII)

wherein R$^3$, R$^8$ and d are as described with reference to formulae (VI) and (VII) above. Any of the R$^3$ groups may be linked to any other of the R$^3$ groups to form a ring. The ring so formed may be unsubstituted or may be substituted with one or more substituents, optionally one or more C$_{1-20}$ alkyl groups.

Repeat units of formula (VIII) may have formula (VIIIa) or (VIIIb):

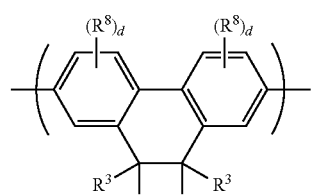

(VIIIa)

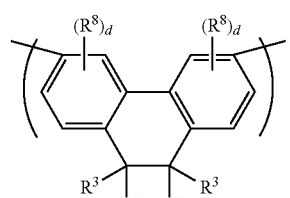

(VIIIb)

An exemplary repeat unit of formula (VIII) has the following structure, wherein aromatic carbon atoms may each independently be unsubstituted or substituted with a substituent R$^8$, and wherein the cyclopentyl groups may each independently be unsubstituted or substituted with one or more substituents, for example one or more C$_{1-20}$ alkyl groups:

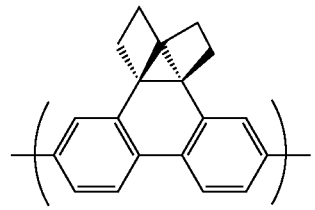

Light Emitting Material

The light-emitting material may be selected from any form of organic fluorescent material including, without limitation, small molecules, dendrimeric and polymeric fluorescent materials.

A light-emitting polymer may be a light-emitting homopolymer comprising light-emitting repeat units, or it may be a copolymer comprising light-emitting repeat units and further repeat units such as hole transporting and/or electron transporting repeat units as disclosed in, for example, WO 00/55927. Each repeat unit may be provided in a main chain or side chain of the polymer.

A light-emitting polymer may contain repeat units in the polymer backbone that are conjugated together.

Light-emitting polymers may contain arylamine repeat units, for example repeat units of formula (IX):

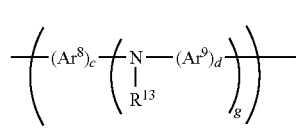

(IX)

wherein Ar$^8$ and Ar$^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (IX) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (IX) may be linked by a direct bond or a divalent linking atom or group to another of $Ar^8$, $Ar^9$ and $Ar^{10}$. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{10}$, wherein each $R^{10}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutane group Preferred repeat units of formula (IX) have formulae 1-3:

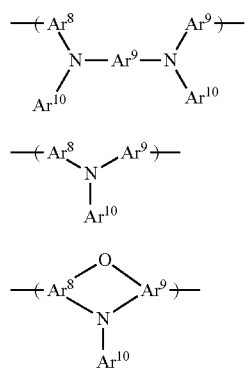

The polymer may contain one, two or more different repeat units of formula (IX).

In one optional arrangement, central $Ar^9$ group linked to two N atoms, for example as in formula 1, is phenylene that may be unsubstituted or substituted with one or more substituents $R^{10}$.

In another optional arrangement, the central $Ar^9$ group of formula 1 is a polycyclic aromatic that may be unsubstituted or substituted with one or more substituents $R^{10}$. Exemplary polycyclic aromatic groups are naphthalene, perylene, anthracene, fluorene, phenanthrene and dihydrophenanthrene. Each of these polycyclic aromatic groups may be substituted with one or more substituents $R^{10}$. Two substituents $R^{10}$ may be linked to form a substituted or unsubstituted ring.

Optionally, $Ar^8$ is phenyl that may be unsubstituted or substituted with one or more substituents $R^{10}$.

Optionally, $Ar^9$ groups linked to only one N atom of the repeat unit of formula (IX) are phenyl that may be unsubstituted or substituted with one or more substituents $R^{10}$.

$R^{13}$ of formula (IXa) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

Optionally, $R^{13}$ is $Ar^{10}$, for example phenyl, or is —$(Ar^{10})_r$ wherein r is at least 2 and wherein the group —$(Ar^{10})_r$ forms a linear or branched chain of aromatic or heteroaromatic groups, for example 3,5-diphenylbenzene wherein each phenyl may be substituted with one or more substituents R10, for example one or more $C_{1-20}$ alkyl groups.

Optionally, c, d and g are each 1 and $Ar^8$ and $Ar^9$ are phenyl linked by an oxygen atom to form a phenoxazine ring.

Amine repeat units may provide hole-transporting and/or light-emitting functionality. Exemplary light-emitting amine repeat units include a blue light-emitting repeat unit of formula (IXa) and a green light-emitting repeat unit formula (IXb):

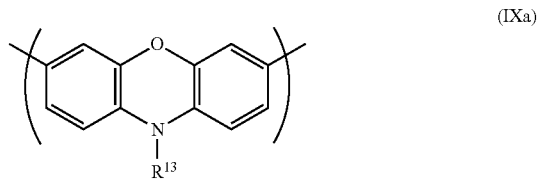

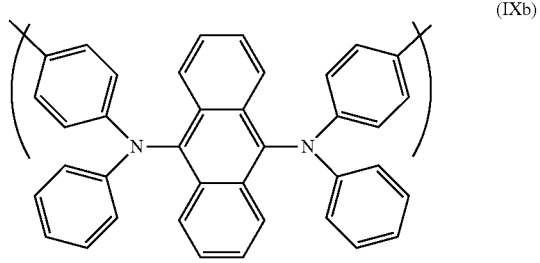

The repeat units of formula (IXa) and (IXb) may be unsubstituted or one or more of the rings of the repeat unit of formula (IXb) may be substituted with one or more substituents $R^{15}$, preferably one or more $C_{1-20}$ alkyl groups.

Amine repeat units may be provided in a copolymer with one or more co-repeat units, and may form 0.5 mol % up to about 50 mol % of the repeat units of the light-emitting copolymer, optionally about 1-25 mol %, optionally about 1-10 mol %.

A fluorescent light-emitting polymer may contain a light-emitting repeat unit and one or more co-repeat units selected from triplet-accepting repeat units and further co-repeat units.

Exemplary triplet-accepting repeat units are as described above.

Exemplary further co-repeat units include, without limitation, fluorene, phenylene, indenofluorene, phenanthrene and dihydrophenanthrene repeat units, each of which may be unsubstituted or substituted with one or more substituents $R^3$, preferably one or more $C_{1-40}$ hydrocarbyl substituents. Further co-repeat units of the light-emitting polymer may include one or more of the co-repeat units (VI), (VII) and (VIII) described above with reference to the triplet-accepting polymer. Each of these repeat units may be linked to adjacent repeat units through any two of the aromatic carbon atoms of these units.

In a preferred embodiment, a light-emitting polymer comprises a light-emitting repeat unit, optionally a repeat unit of formula (IX), and a first triplet-accepting group of formula (I) provided as a main-chain repeat unit, side group or end group of the light-emitting polymer.

The polystyrene-equivalent number-average molecular weight (Mn) measured by gel permeation chromatography of the polymers described herein, including light-emitting polymers that may or may not contain triplet-accepting groups and non-emissive triplet-accepting polymers, may be in the range of about $1\times10^3$ to $1\times10^8$, and preferably $1\times10^4$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

Polymers as described herein are suitably amorphous.

Polymer Synthesis

Preferred methods for preparation of conjugated light-emitting polymers comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable π—Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Charge Transporting and Charge Blocking Layers

In the case of an OLED, a hole transporting layer may be provided between the anode and the light-emitting layer or layers. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A charge-transporting layer or charge-blocking layer may be cross-linked, particularly if a layer overlying that charge-transporting or charge-blocking layer is deposited from a solution. The cross linkable group used for this cross linking may be a cross linkable group comprising a reactive double bond such and a vinyl or acrylate group, or a benzocyclobutane group.

If present, a hole transporting layer located between the anode and the light-emitting layers preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

A hole transporting layer may contain a homopolymer or copolymer comprising a repeat unit of formula (IX) as described above, for example a copolymer comprising one or more amine repeat units of formula (IX) and one or more arylene repeat units, for example one or more arylene repeat units selected from formulae (VI), (VII) and (VIII).

An electron transporting layer may contain a polymer comprising a chain of optionally substituted arylene repeat units, such as a chain of fluorene repeat units.

If a hole- or electron-transporting layer is adjacent a light-emitting layer containing a phosphorescent material then the $T_1$ energy level of the material or materials of that layer are preferably higher than that of the phosphorescent emitter in the adjacent light-emitting layer.

Hole Injection Layers

A conductive hole injection layer, which may be formed from a conductive organic or inorganic material, may be provided between the anode 101 and the light-emitting layer 103 of an OLED as illustrated in FIG. 1 to assist hole injection from the anode into the layer or layers of semi-conducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode 105 is selected from materials that have a workfunction allowing injection of electrons into the light-emitting layer of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low work function material and a high work function material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin (e.g. 1-5 nm) layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a light-emitting layer may be formed from the composition of the invention and one or more suitable solvents.

The formulation may be a solution of the composition in the one or more solvents, or may be a dispersion in the one or more solvents in which one or more components are not dissolved. Preferably, the formulation is a solution.

Solvents suitable for dissolving compositions of the invention, particularly compositions containing polymers comprising alkyl substituents, include benzenes substituted with one or more $C_{1-10}$ alkyl or $C_{1-10}$ alkoxy groups, for example toluene, xylenes and methylanisoles.

Particularly preferred solution deposition techniques include printing and coating techniques such as spin-coating and inkjet printing.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

EXAMPLES

Monomer Synthesis

Monomer Example 1 was prepared according to the following reaction scheme:

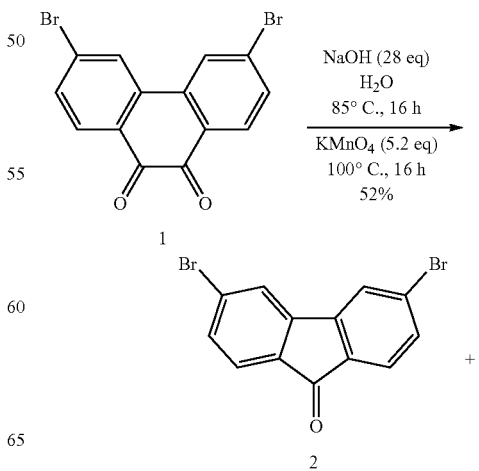

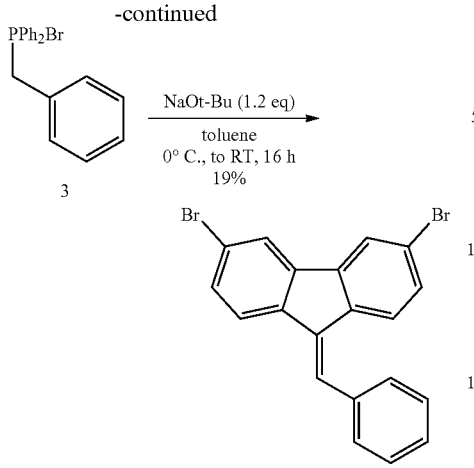

Stage 1

A 3 L 3-necked round-bottomed flask was equipped with an over head stirrer, reflux condenser, addition funnel, nitrogen inlet and exhaust. The flask was charged with NaOH (153 g, 3.8251 mol) in water (1000 mL and 3, 6-dibromophenanthrene-9,10-dione (50 g, 0.1366 mol) and heated to 85° C. for 16 hours before being allowed to cool to room temperature.

Solid $KMnO_4$ (112.2 g, 0.7103 mol) was added in several portions to the mixture. After addition was complete the reaction mixture was heated to 100° C. and stirred for 16 h, after which time it was allowed to cool to room temperature. The resulting solid precipitate was isolated by filtration and washed with 1.5 N HCl (1000 mL) and water (1000 mL). After drying under suction the solid was washed with hot chloroform, followed by THF, to afford 6-dibromo-9H-fluoren-9-one with 98.5% purity as measured by HPLC (24 g, 52% yield).

Stage 2

A 1 L 3-necked round-bottomed flask was equipped with an over head stirrer, reflux condenser, addition funnel, nitrogen inlet and exhaust. Under nitrogen atmosphere benzyltriphenylphosphonium bromide (35.38 g, 0.0816 mol) was dissolved in toluene (300 mL) and NaOtBu (8.99 g, 0.0816 mol) was added to the mixture portion wise at 0° C. and the suspension stirred for 30 minutes. The solution was kept at 0° C. and 3, 6-Dibromo-9H-fluoren-9-one (23 g, 0.0681 mol) in toluene (160 mL) was added to the mixture and the resultant mixture allowed to warm to room temperature and stirred for 16 hours. After that time the mixture was re-cooled to 0° C. and quenched with ice water (200 mL). The reaction was diluted with EtOAc (500 mL) and the organic layer was separated and washed with water (200 mL), dried over sodium sulphate and the volatiles removed under reduced pressure. The crude material (32 g) was purified by flash column chromatography, followed by recrystallisation from acetonitrile to afford Monomer 1 in 19% yield.

$^1$H-NMR (400 MHz, $CDCl_3$) δ [ppm] 7.22 (dd, J=1.84, 8.36 Hz, 1H), 7.43 (d, J=8.12 Hz, 1H), 7.45-7.50 (m, 4H), 7.56 (d, J=7.16 Hz, 2H), 7.66 (d, J=8.20 Hz, 1H), 7.72 (s, 1H), 7.81-7.83 (m, 2H).

Light-Emitting Polymers

A blue light-emitting polymer LEP1 containing fluorene repeat units of formula (VIIa), a phenanthrene repeat unit, an amine repeat unit of formula (IX-1) and an amine repeat unit of formula (IX-3) was prepared by Suzuki polymerisation as described in WO 00/53656.

A blue light-emitting polymer LEP2 was prepared as for LEP1 except that 0.5 mol % of a fluorene repeat unit was replaced with a triplet-accepting repeat unit derived from Monomer 1.

Triplet-Accepting Polymer 1

Triplet-accepting polymer 1 was prepared by polymerisation of the following monomers by Suzuki polymerisation as described in WO 00/53656:

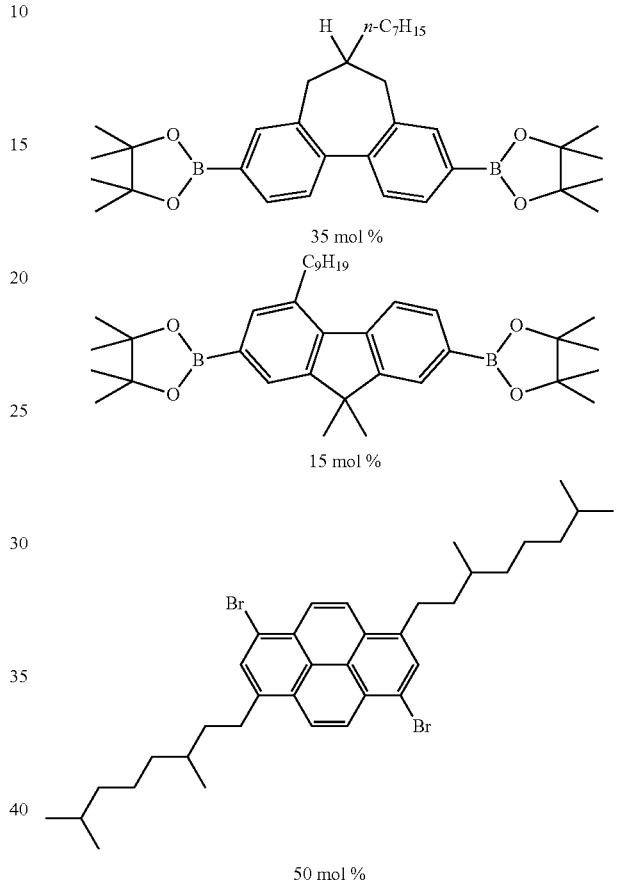

Device Formation—General Process

A blue organic light-emitting device having the following structure was prepared:

ITO/HIL (35 nm)/HTL (22 nm)/LE (65 nm)/Cathode, wherein ITO is an indium-tin oxide anode; HIL is a hole-injecting layer; HTL is a hole-transporting layer; LE is a light-emitting layer; and the cathode comprises a layer of metal fluoride in contact with the light-emitting layer and a layer of silver and a layer of aluminium.

To form the device, a substrate carrying ITO was cleaned using UV/Ozone. The hole injection layer was formed by spin-coating an aqueous formulation of a hole-injection material available from Plextronics, Inc. The hole transporting layer was formed to a thickness of 21 nm by spin-coating a hole transporting polymer comprising phenylene repeat units of formula (VIa), amine repeat units of formula (IX-1) and crosslinkable repeat units of formula (VIIa) and cross-linking the polymer by heating. The light-emitting layer was formed by spin-coating a polymer or a polymer mixture as shown in Table 2. The cathode was formed by evaporation of a first layer of a metal fluoride to a thickness of about 2 nm, a second layer of aluminium to a thickness of about 100 nm and a third layer of silver to a thickness of about 100 nm.

Figure 6:
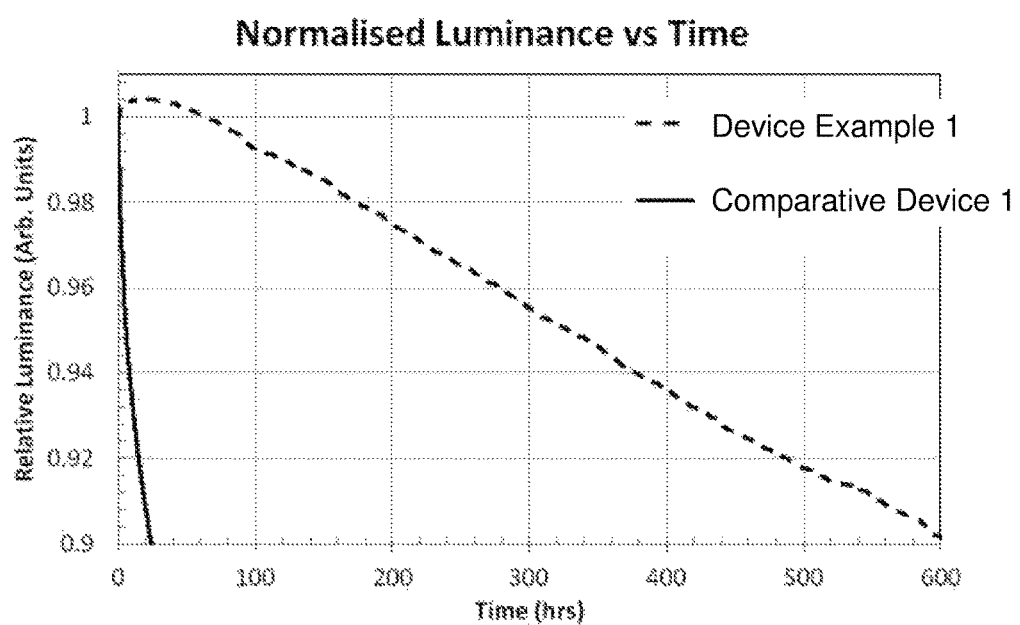
FIG. 6 is a graph of luminance vs. time for a comparative device and a device according to an embodiment of the invention.

With reference to FIG. 6, the brightness of Comparative Device 1, in which a triplet-accepting unit is not provided in the light-emitting polymer, falls faster than that of Device Example 1 in which a triplet-accepting unit is provided in the light-emitting polymer along with the triplet-accepting polymer blending with the light-emitting polymer.

Surprisingly, use of two different triplet-accepting materials increases lifetime as compared to use of only one triplet-accepting material.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising a light-emitting polymer having a backbone, a first triplet-accepting material covalently bound to the light-emitting polymer, and a second triplet-accepting material that is different from the first triplet-accepting material and that is mixed with the light-emitting polymer.

2. A composition according to claim 1, wherein light-emitting material is provided as a repeat unit in the backbone; as a side-group pendant from the backbone; or as an end-group of the polymer.

3. A composition according to claim 2 wherein the light-emitting material is provided as a repeat unit of formula (IX) in the polymer backbone:

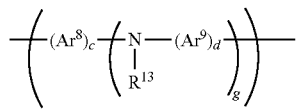

(IX)

wherein $Ar^8$ and $Ar^9$ in each occurrence are independently substituted or unsubstituted aryl or heteroaryl, g is greater than or equal to 1, $R^{13}$ is H or a substituent, and c and d are each independently 1, 2 or 3; and any two of $Ar^8$, $Ar^9$ and $R^{13}$ directly bound to the same N atom may be linked by a direct bond or a divalent linking group to form a ring.

4. A composition according to claim 1, wherein the first triplet accepting material is a repeat unit in the backbone; a side-group pendant from the backbone; or an end-group of the polymer.

5. A composition according to claim 4 wherein the first triplet-accepting material is provided as a repeat unit of formula (I) in the polymer backbone:

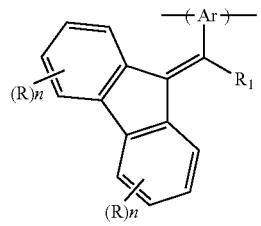

(I)

wherein Ar is an aryl or heteroaryl group that may be unsubstituted or substituted with one or more substituents; $R^1$ is H or a substituent; R in each occurrence is independently a substituent; and n in each occurrence is independently 0 or a positive integer.

6. A composition according to claim 5 wherein Ar is phenyl that may be unsubstituted or substituted with one or more substituents.

7. A composition according to claim 5 wherein $R^1$ is H.

8. A composition according to claim 1, wherein the second triplet-accepting material is provided as a backbone repeat unit, side group or end group of a triplet-accepting polymer.

9. A composition according to claim 8 wherein the second triplet-accepting material is a polycyclic aromatic repeat unit of the triplet-accepting polymer.

10. A composition according to claim 9 wherein the polycyclic aromatic co-repeat unit is selected from anthracene and pyrene, each of which may be unsubstituted or substituted with one or more substituents.

11. A composition according to claim 10 wherein the second triplet-accepting material is provided as a repeat unit of formula (II) or (III):

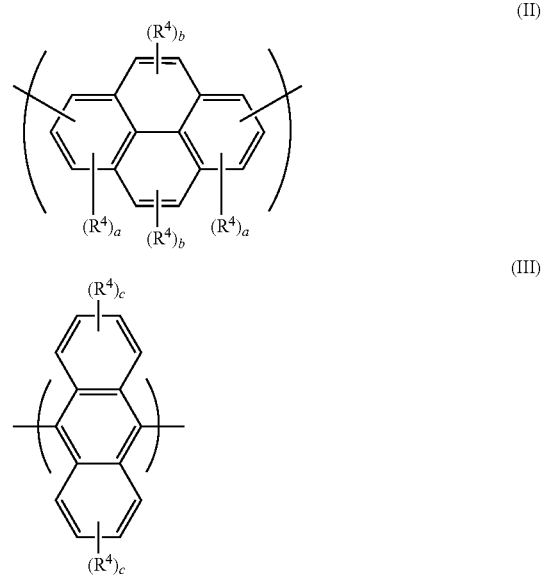

wherein $R^4$ in each occurrence is independently a substituent; each a is independently 0, 1 or 2; each b is independently 0, 1 or 2; and each c is 0, 1, 2, 3 or 4.

12. An organic light-emitting device comprising an anode, a cathode and a light-emitting layer between the anode and the cathode wherein the light-emitting layer comprises a composition comprising a light-emitting polymer having a backbone, a first triplet-accepting material covalently bound to the light-emitting polymer, and a second triplet-accepting material that is different from the first triplet-accepting material and that is mixed with the light-emitting polymer.

13. A method of forming an organic light-emitting device according to claim 12, the method comprising the steps of forming the light-emitting layer over one of the anode and cathode, and forming the other of the anode and cathode over the light-emitting layer.

14. A method according to claim 13 wherein the light-emitting layer is formed by depositing formulation comprising a composition comprising a light-emitting material, a first triplet-accepting material, a second triplet-accepting material that is different from the first triplet-accepting material and at least one solvent over the one of the anode and cathode and evaporating the at least one solvent.

* * * * *